(12) United States Patent
Lin et al.

(10) Patent No.: US 10,191,806 B2
(45) Date of Patent: Jan. 29, 2019

(54) DECODING METHOD, MEMORY STORAGE DEVICE AND MEMORY CONTROL CIRCUIT UNIT

(71) Applicant: PHISON ELECTRONICS CORP., Miaoli (TW)

(72) Inventors: Yu-Hsiang Lin, Yunlin County (TW); Shao-Wei Yen, Kaohsiung (TW); Cheng-Che Yang, New Taipei (TW); Kuo-Hsin Lai, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 1 day.

(21) Appl. No.: 15/299,469

(22) Filed: Oct. 21, 2016

(65) Prior Publication Data

US 2018/0046542 A1  Feb. 15, 2018

(30) Foreign Application Priority Data

Aug. 12, 2016  (TW) .............................. 105125706 A

(51) Int. Cl.
| | |
|---|---|
| G06F 11/10 | (2006.01) |
| G11C 29/52 | (2006.01) |
| H03M 13/15 | (2006.01) |
| G06F 3/06 | (2006.01) |
| H03M 13/11 | (2006.01) |
| H03M 13/37 | (2006.01) |

(52) U.S. Cl.
CPC .......... *G06F 11/1068* (2013.01); *G06F 3/064* (2013.01); *G06F 3/0611* (2013.01); *G06F 3/0619* (2013.01); *G06F 3/0659* (2013.01); *G06F 3/0679* (2013.01); *G06F 3/0688* (2013.01); *H03M 13/1108* (2013.01); *H03M 13/1575* (2013.01); *H03M 13/3715* (2013.01); *G11C 29/52* (2013.01)

(58) Field of Classification Search
None
See application file for complete search history.

(56) References Cited

U.S. PATENT DOCUMENTS

| | | | |
|---|---|---|---|
| 2015/0358036 A1* | 12/2015 | Tseng ................. | H03M 13/1128 714/755 |
| 2015/0381206 A1* | 12/2015 | Fainzilber .......... | H03M 13/1108 714/758 |
| 2016/0188213 A1* | 6/2016 | Lin ..................... | G11C 16/3459 711/103 |
| 2017/0294217 A1* | 10/2017 | Lin .......................... | G11C 7/00 |

\* cited by examiner

*Primary Examiner* — Justin R Knapp
(74) *Attorney, Agent, or Firm* — JCIPRNET

(57) ABSTRACT

In one exemplary embodiment, the decoding method includes: reading first data from a plurality of first memory cells of a rewritable non-volatile memory module; performing a first decoding operation on the first data based on a first decoding condition; and performing a second decoding operation on the first data based on a second decoding condition if the first decoding operation conforms to a first default status, where a strict level of locating an error bit in the first data based on the second decoding condition is higher than a strict level of locating the error bit in the first data based on the first decoding condition. Therefore, a decoding efficiency of a memory storage device can be improved.

12 Claims, 10 Drawing Sheets

$$\begin{Bmatrix} 0 & 0 & 1 & 0 & 1 & 0 & 0 & 1 & 1 \\ 1 & 0 & 0 & 0 & 1 & 0 & 1 & 0 & 0 \\ 0 & 1 & 0 & 1 & 0 & 0 & 0 & 1 & 0 \\ 0 & 1 & 0 & 0 & 1 & 0 & 0 & 1 & 0 \\ 1 & 0 & 0 & 1 & 0 & 0 & 1 & 0 & 1 \\ 0 & 0 & 1 & 1 & 0 & 1 & 0 & 0 & 1 \\ 0 & 1 & 0 & 0 & 0 & 1 & 1 & 0 & 0 \\ 1 & 0 & 1 & 0 & 0 & 1 & 0 & 0 & 0 \end{Bmatrix} \begin{Bmatrix} V_0 \\ V_1 \\ V_2 \\ V_3 \\ V_4 \\ V_5 \\ V_6 \\ V_7 \\ V_8 \end{Bmatrix} = \begin{Bmatrix} S_0 \\ S_1 \\ S_2 \\ S_3 \\ S_4 \\ S_5 \\ S_6 \\ S_7 \end{Bmatrix}$$

1000     1001     1002

| $S_1$ | $S_2$ | $S_0$ | $S_2$ | $S_0$ | $S_5$ | $S_1$ | $S_0$ | $S_0$ |
|---|---|---|---|---|---|---|---|---|
| + | + | + | + | + | + | + | + | + |
| $S_4$ | $S_3$ | $S_5$ | $S_4$ | $S_1$ | $S_6$ | $S_4$ | $S_2$ | $S_4$ |
| + | + | + | + | + | + | + | + | + |
| $S_7$ | $S_6$ | $S_7$ | $S_5$ | $S_3$ | $S_7$ | $S_6$ | $S_3$ | $S_5$ |
| ↓ | ↓ | ↓ | ↓ | ↓ | ↓ | ↓ | ↓ | ↓ |
| $E_0$ | $E_1$ | $E_2$ | $E_3$ | $E_4$ | $E_5$ | $E_6$ | $E_7$ | $E_8$ |

FIG. 10

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 105125706, filed on Aug. 12, 2016. The entirety of the above-mentioned patent application is hereby incorporated by reference herein and made a part of this specification.

BACKGROUND

Technical Field

The disclosure relates to a decoding technology, and more particularly, to a decoding method, a memory storage device and a memory control circuit unit.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

In general, a memory device is built in with one or more decoding mechanisms, which are configured to correct possible errors included in data read from the memory device. For example, the decoding mechanisms may include decoding algorithms such as a Bit-Flipping algorithm, a Min-Sum algorithm, a Sum-Product and the like. When the memory device left the factory, the decoding algorithm built in the memory device is configured to use optimal operating parameters. However, variation will occur on a channel status of the memory device with increases in usage time and/or usage frequency of the memory device. If the variation of the channel status of the memory device is overly severe, the memory device often shows a poor decoding efficiency even if the optimal operating parameters is already in use.

Nothing herein should be construed as an admission of knowledge in the prior art of any portion of the present disclosure. Furthermore, citation or identification of any document in this application is not an admission that such document is available as prior art to the present disclosure, or that any reference forms a part of the common general knowledge in the art.

SUMMARY

The disclosure is directed to a decoding method, a memory storage device and a memory control circuit unit, which are capable of improving a decoding efficiency of the memory storage device.

An exemplary embodiment of the disclosure provides a decoding method for a rewritable non-volatile memory module including a plurality of memory cells, and the decoding method includes: reading first data from a plurality of first memory cells among the memory cells; performing a first decoding operation on the first data based on a first decoding condition; and performing a second decoding operation on the first data based on a second decoding condition if the first decoding operation conforms to a first default status, where a strict level of locating an error bit in the first data based on the second decoding condition is higher than a strict level of locating the error bit in the first data based on the first decoding condition.

Another exemplary embodiment of the disclosure provides a memory storage device, which includes a connection interface unit, a rewritable non-volatile memory module and a memory control circuit unit. The connection interface unit is configured to couple to a host system. The rewritable non-volatile memory module comprises a plurality of memory cells. The memory control circuit unit is coupled to the connection interface unit and the rewritable non-volatile memory module. The memory control circuit is configured to send a read command sequence, where the read command sequence instructs reading first data from a plurality of first memory cells among the memory cells, and the memory control circuit unit is further configured to perform a first decoding operation on the first data based on a first decoding condition. The memory control circuit unit is further configured to perform a second decoding operation on the first data based on a second decoding condition if the first decoding operation conforms to a first default status, where a strict level of locating an error bit in the first data based on the second decoding condition is higher than a strict level of locating the error bit in the first data based on the first decoding condition.

Another exemplary embodiment of the disclosure provides a memory control circuit unit, which is configured to control a rewritable non-volatile memory module. The rewritable non-volatile memory module includes a plurality of memory cells, and the memory control circuit unit includes a host interface, a memory interface, an error checking and correcting circuit and a memory management circuit. The host interface is configured to be coupled to a host system. The memory interface is configured to couple to the rewritable non-volatile memory module. The memory management circuit is coupled to the host interface, the memory interface and the error checking and correcting circuit. The memory management circuit is configured to send a read command sequence, where the read command sequence instructs reading first data from a plurality of first memory cells among the memory cells, and the error checking and correcting circuit is configured to perform a first decoding operation on the first data based on a first decoding condition. The error checking and correcting circuit is further configured to perform a second decoding operation on the first data based on a second decoding condition if the first decoding operation conforms to a first default status, where a strict level of locating an error bit in the first data based on the second decoding condition by the error checking and correcting circuit is higher than a strict level of locating the error bit in the first data based on the first decoding condition by the error checking and correcting circuit.

Based on the above, after the first decoding operation conforms to the first default status, the decoding condition adopted by the decoding algorithm is updated, such that the error bits in the data to be decoded is located more strictly thereafter. Accordingly, the processing efficiency of the decoding operation encountering an error which is unable to be converged may be improved.

To make the above features and advantages of the present invention more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 10 is a schematic diagram illustrating a parity check operation according to an exemplary embodiment of the disclosure.

DESCRIPTION OF THE EMBODIMENTS

Figure 1:
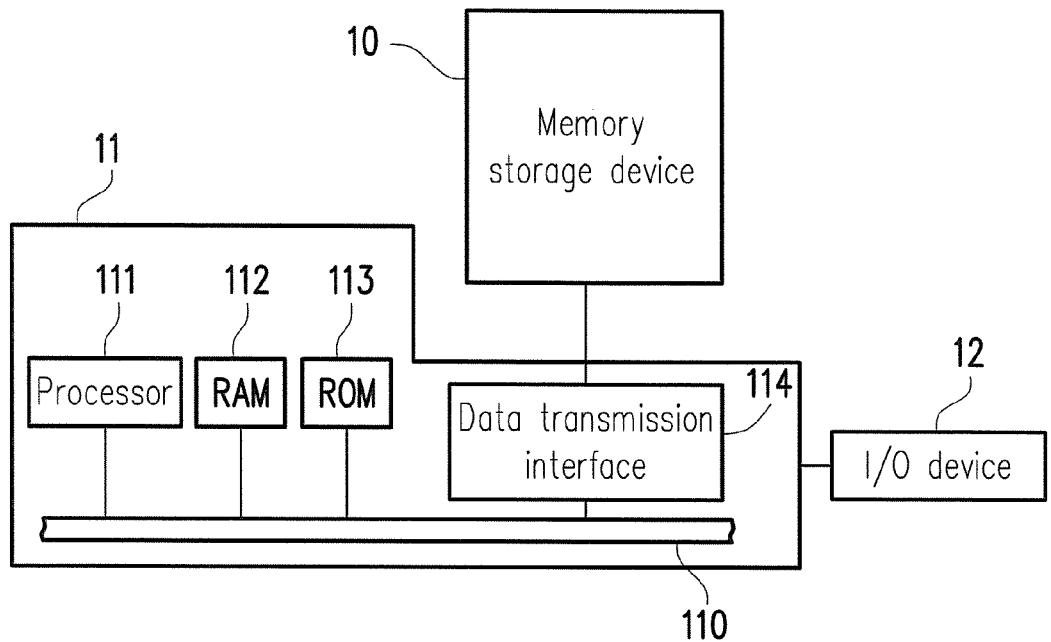
FIG. 1 is a schematic diagram illustrating a host system, a memory storage device and an I/O (input/output) device according to an exemplary embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Embodiments of the present disclosure may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, the memory storage device (also known as a memory storage system) includes a rewritable non-volatile memory module and a controller (also known as a control circuit). The memory storage device is usually configured together with a host system so that the host system may write data into the memory storage device or read data from the memory storage device.

Figure 2:
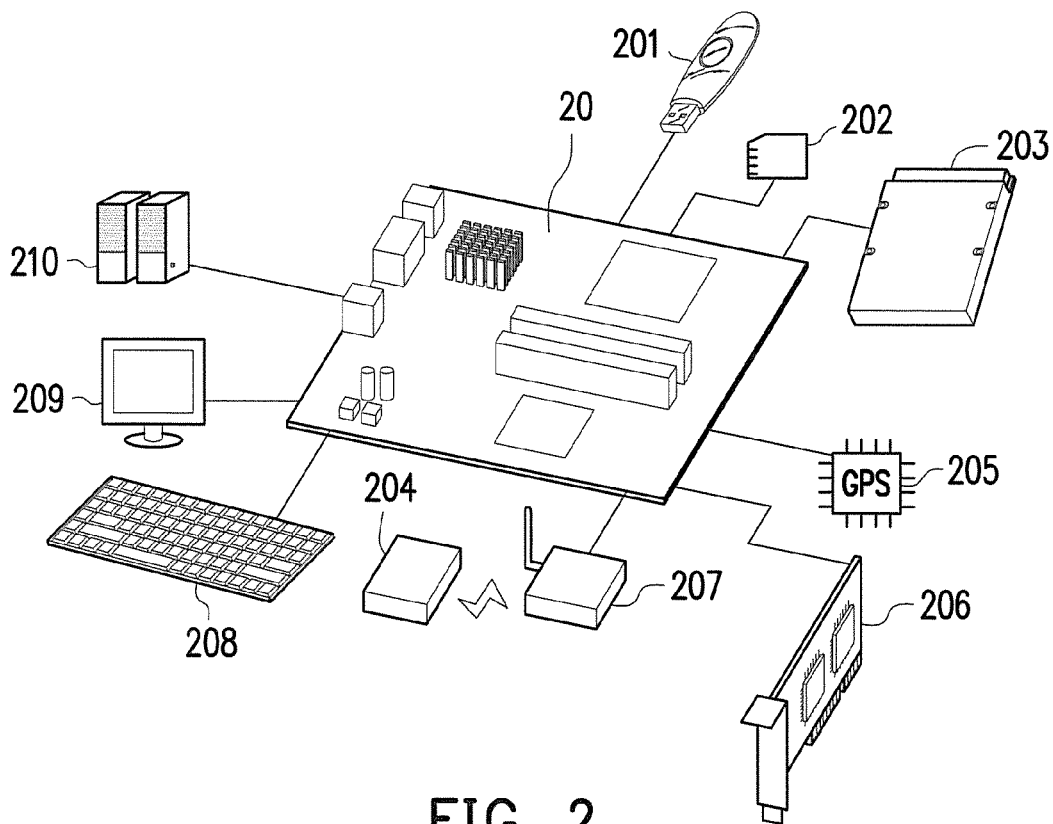
FIG. 2 is a schematic diagram illustrating a host system, a memory storage device and an I/O device according to another exemplary embodiment of the disclosure.

FIG. 1 is a schematic diagram illustrating a host system, a memory storage device and an I/O (input/output) device according to an exemplary embodiment of the disclosure. FIG. 2 is a schematic diagram illustrating a host system, a memory storage device and an I/O device according to another exemplary embodiment of the disclosure. Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 through the system bus 110. For example, the host system 11 can transmit output signals to the I/O device 12 or receive input signals from I/O device 12 through the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a Bluetooth low energy memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 may access the wireless memory storage device 204 through the wireless transmission device 207.

Figure 3:
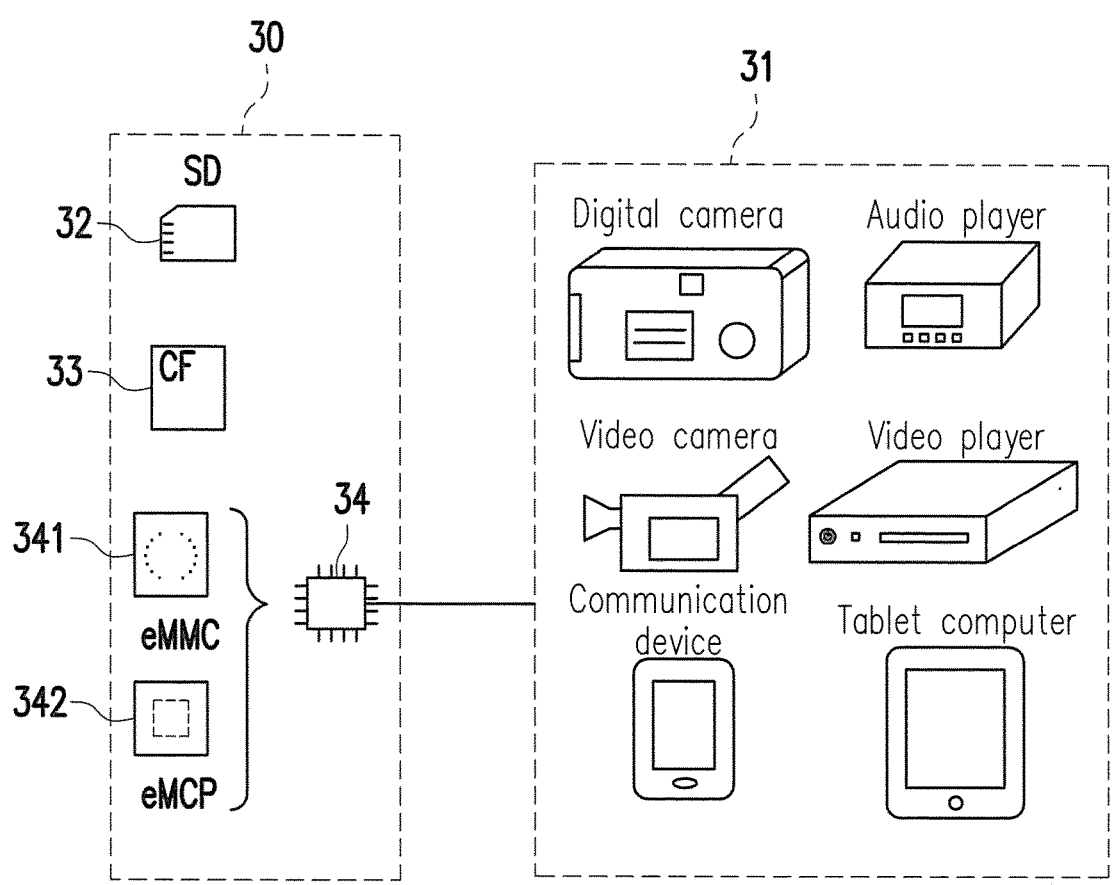
FIG. 3 is a schematic diagram illustrating a host system and a memory storage device according to another exemplary embodiment of the disclosure.

In exemplary embodiment, aforementioned host system may be any system capable of substantially cooperating with the memory storage device for storing data. The host system is illustrated as a computer system in foregoing exemplary embodiment; nonetheless, FIG. 3 is a schematic diagram illustrating a host system and a memory storage device according to another exemplary embodiment of the disclosure. Referring to FIG. 3, a host system 31 may also be a system including a digital camera, a video camera, a communication device, an audio player, a video player or a tablet computer, whereas a memory storage device 30 may be various non-volatile memory devices used by the host system 31, such as a SD (Secure Digital) card 32, a CF (Compact Flash) card 33 or an embedded storage device 34. The embedded storage device 34 includes various embedded storage devices capable of directly coupling a memory module onto a substrate of the host system 31, such as an eMMC (embedded Multi Media Card) 341 and/or an eMCP (embedded Multi Chip Package) storage device 342.

Figure 4:
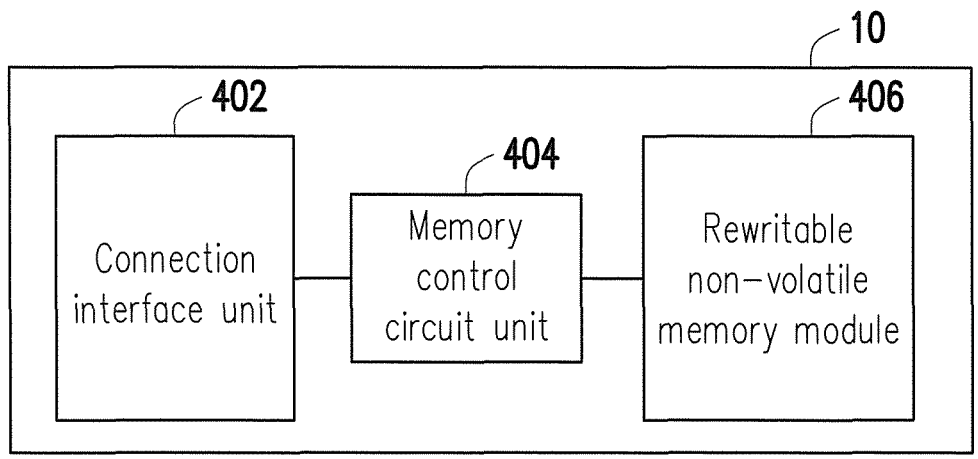
FIG. 4 is a schematic block diagram illustrating a memory storage device according to an exemplary embodiment of the disclosure.

FIG. 4 is a schematic block diagram illustrating a memory storage device according to an exemplary embodiment of the disclosure. Referring to FIG. 4, the memory storage device 10 includes a connection interface unit 402, a memory control circuit unit 404 and a rewritable non-volatile memory module 406.

In the present exemplary embodiment, the connection interface unit 402 is compatible with a SATA (Serial Advanced Technology Attachment) standard. Nevertheless, it should be understood that the disclosure is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 is distributed outside of a chip containing the memory control circuit unit 404. For example, the connection interface unit 402 is configured to couple to the host system 11.

The memory control circuit unit 404 is configured to execute a plurality of logic gates or control commands which are implemented in a hardware form or in a firmware form and perform operations of writing, reading or erasing data in the rewritable non-volatile memory module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

In the present exemplary embodiment, the memory cells of the rewritable non-volatile memory module 406 constitute a plurality of physical programming units, and the physical programming units constitute a plurality of physical erasing units. For example, the memory cells on the same word line constitute one or more of the physical programming units. If each of the memory cells can store more than one bit, the physical programming units on the same word line can be at least classified into a lower physical programming unit and an upper physical programming unit. For example, a LSB (Least Significant Bit) of one memory cell belongs to the lower physical programming unit, and a MSB (most significant bit) of one memory cell belongs to the upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

In the present exemplary embodiment, the physical programming unit is a minimum unit for programming. That is, the physical programming unit is the minimum unit for writing data. For example, the physical programming unit is a physical page or a physical sector. If the physical programming unit is the physical page, the physical programming unit usually includes a data bit area and a redundancy bit area. The data bit area includes multiple physical sectors configured to store user data, and the redundant bit area is configured to store system data (e.g., an error correcting code). In the present exemplary embodiment, the data bit area contains 32 physical sectors, and the size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimal unit for erasing. Namely, each physical erasing unit contains the least number of memory cells to be erased together. For instance, the physical erasing unit is a physical block.

In the present exemplary embodiment, one or more bits in the rewritable non-volatile memory module 406 are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This process of changing the threshold voltage is also known as "writing data into the memory cell" or "programming the memory cell". With changes in the threshold voltage, each of the memory cells in the rewritable non-volatile memory module 406 has a plurality of storage states. The storage state to which the memory cell belongs may be determined by applying a read voltage, so as to obtain the one or more bits stored in the memory cell.

Figure 5:
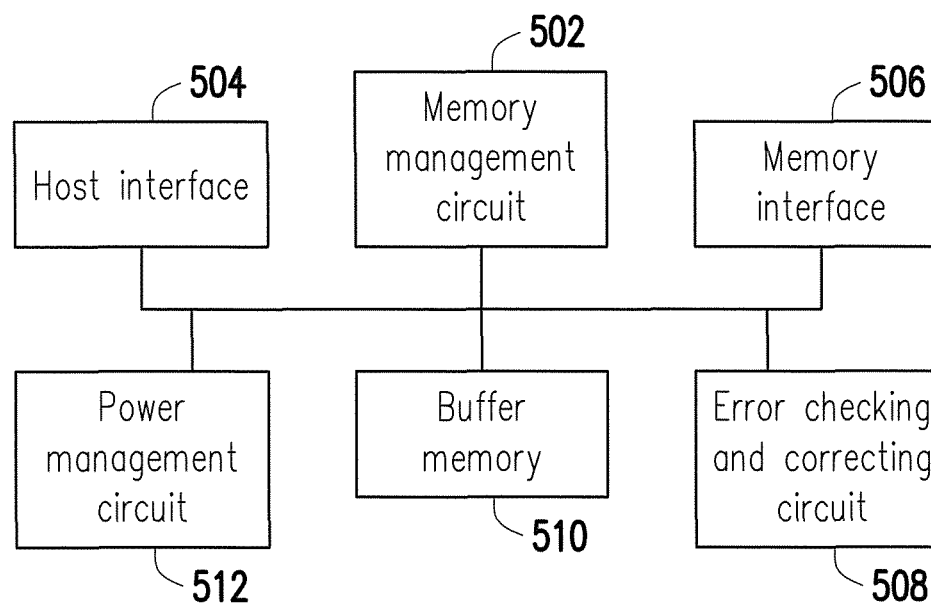
FIG. 5 is a schematic block diagram illustrating a memory control circuit unit according to an exemplary embodiment of the disclosure.

FIG. 5 is a schematic block diagram illustrating a memory control circuit unit according to an exemplary embodiment of the disclosure.

Referring to FIG. 5, the memory control circuit unit 404 includes a memory management circuit 502, a host interface 504, a memory interface 506 and an error checking and correcting circuit 508.

The memory management circuit 502 is configured to control overall operations of the memory control circuit unit 404. Specifically, the memory management circuit 502 has a plurality of control commands. During operations of the memory storage device 10, the control commands are executed to perform various operations such as writing, reading and erasing data. Hereinafter, description for operations of the memory management circuit 502 is equivalent to description for operations of the memory control circuit unit 404.

In the present exemplary embodiment, the control commands of the memory management circuit 502 are implemented in form of firmware. For instance, the memory management circuit 502 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 502 may also be stored as program codes in a specific area (for example, the system area in a memory exclusively used for storing system data) of the rewritable non-volatile memory module 406. In addition, the memory management circuit 502 has a microprocessor unit (not illustrated), the read only memory (not illustrated) and a random access memory (not illustrated). Particularly, the ROM has a boot code, which is executed by the microprocessor unit to load the control commands stored in the rewritable non-volatile memory module 406 to the RAM of the memory management circuit 502 when the memory control circuit unit 404 is enabled. Later, the control commands are executed by the microprocessor unit to perform operations of writing, reading or erasing data.

Further, in another exemplary embodiment, the control commands of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells or a group thereof. The memory writing circuit is configured to issue a write command sequence for the rewritable non-volatile memory module 406 in order to write data into the rewritable non-volatile memory module 406. The memory reading circuit is configured to issue a read command sequence for the rewritable non-volatile memory module 406 in order to read data from the rewritable non-volatile memory module 406. The memory erasing circuit is configured to issue an erase command sequence for the rewritable non-volatile memory module 406 in order to erase data from the rewritable non-volatile memory module 406. The data processing circuit is configured to process both the data to be written into the rewritable non-volatile memory module 406 and the data to be read from the rewritable non-volatile memory module 406. Each of the write command sequence, the read command sequence and the erase command sequence may include one or more program codes or command codes, respectively, and instruct the rewritable non-volatile memory module 406 to perform the corresponding operations, such as writing, reading and erasing. In an exemplary embodiment, the memory management circuit 502 may further issue command sequences of other types to the rewritable non-volatile memory module 406 for instructing to perform the corresponding operations.

In the present exemplary embodiment, the memory management circuit 502 configures a plurality of logical units for mapping to the physical erasing units in the rewritable non-volatile memory module 406. Herein, one logical unit may refer to one logical address, one logical programming unit, one logical erasing unit, or may be constituted by a plurality of consecutive or non-consecutive logical addresses. In addition, one logical unit may be mapped to one or more physical erasing units.

In the present exemplary embodiment, the memory management circuit 502 records a mapping relationship (also known as a logical-to-physical mapping relationship) between the logical units and the physical erasing units into at least one logical-to-physical mapping table. When the host system 11 intends to read data from the memory storage device 10 or write data into the memory storage device 10, the memory management circuit 502 may access the data in the memory storage device 10 according to the logical-to-physical mapping table.

The host interface 504 is coupled to the memory management circuit 502 and configured to receive and identify commands and data sent from the host system 11. In other words, the commands and data sent from the host system 11 are passed to the memory management circuit 502 through the host interface 504. In the present exemplary embodiment, the host interface 504 is compatible with the SATA standard. However, it should be understood that the present disclosure is not limited thereto, and the host interface 504 may also be compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the memory management circuit 502 and configured to access the rewritable non-volatile memory module 406. The memory interface 506 is coupled to the memory management circuit 502 for accessing the rewritable non-volatile memory module 406. That is, data to be written to the rewritable non-volatile memory module 406 is converted to a format acceptable to the rewritable non-volatile memory module 406 through the memory interface 506. Specifically, if the memory management circuit 502 intends to access the rewritable non-volatile memory module 406, the memory interface 506 sends corresponding command sequences. For example, the command sequences may include the write command sequence which instructs to write data, the read command sequence which instructs to read data, the erase command sequence which instructs to erase data, and command sequences configured to instruct performing various memory operations (e.g., changing read voltage levels, performing a garbage collection process, and so on). These command sequences are generated by the memory management circuit 502 and transmitted to the rewritable non-volatile memory module 406 through the memory interface 506, for example. The command sequences may include one or more signals, or data on the bus. The signals or the data may include command codes and programming codes. For example, in a read command sequence, information such as identification codes and memory addresses are included.

The error checking and correcting circuit 508 is coupled to the memory management circuit 502 and configured to perform an error checking and correcting operation to ensure correctness of the data. Specifically, when the memory management circuit 502 receives the write command from the host system 11, the error checking and correcting circuit 508 generates an ECC (error correcting code) and/or an EDC (error detecting code) for data corresponding to the write command, and the memory management circuit 502 writes data corresponding to the write command and the ECC and/or the EDC into the rewritable non-volatile memory module 406. Later, the memory management circuit 502 simultaneously reads the ECC and/or the EDC corresponding to the data when reading the data from the rewritable non-volatile memory module 406, and the error checking and correcting circuit 508 performs the error checking and correcting operation on the read data based on the ECC and/or the EDC.

In an exemplary embodiment, the memory control circuit unit 404 further includes a buffer memory 510 and a power management circuit 512. The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control a power of the memory storage device 10.

It is noted that in the following description, some terms may be replaced with corresponding abbreviations for ease of reading (see Table 1).

TABLE 1

| logical-to-physical mapping table | L2P table |
| physical-to-logical mapping table | P2L table |
| rewritable non-volatile memory module | RNVM module |
| physical unit | PU |
| physical erasing unit | PEU |
| physical programming unit | PPU |
| logical unit | LU |
| logical erasing unit | LEU |
| logical programming unit | LPU |
| memory management circuit | MMC |
| memory control circuit unit | MCCU |
| error checking and correcting circuit | ECCC |

In the present exemplary embodiment, the ECCC 508 supports a low-density parity-check (LDPC) code. For example, the ECCC 508 may use the LDPC code for encoding and decoding. In the LDPC code, a valid codeword is defined by using a check matrix (also known as a parity check matrix). Hereinafter, the parity check matrix is marked as a matrix H and a codeword is marked as V. According to Equation (1) below, if a result of the parity check matrix H multiplied by the codeword V is a zero vector, it means that the codeword V is the valid codeword. Therein, an operator $\otimes$ represents a modulo-2 matrix multiplication. In other words, a null space of the matrix H includes all the valid codewords. However, the disclosure is not intended to limit the content of the codeword V. For example, the codeword V may also include the ECC or the EDC generated by using any algorithm.

$$H \otimes V^T = 0 \tag{1}$$

Herein, a dimension of the matrix H is k-by-n, and a dimension of the codeword V is 1-by-n, where k and n are positive integers. The codeword V includes message bits and parity bits, that is, the codeword V may be represented by [U P], wherein a vector U is constituted by the message bits, and a vector P is constituted by the parity bits. A dimension of the vector U is 1-by-(n-k), and a dimension of the vector P is 1-by-k. In one codeword, the parity bits are used for protecting the message bits and may be considered as the ECC or the EDC generated in correspondence to the message bits. Herein, protecting the message bits refers to, for example, maintaining correctness of the message bits. For example, when data is read from the RNVM module 406, the parity bits in said data may be used to correct possible errors in the corresponding data.

In an exemplary embodiment, the message bits and the parity bits in one codeword are collectively known as data bits. For example, the codeword V includes n data bits, wherein a length of the message bits is (n-k) bits, and a length of the parity bits is k bits. Accordingly, a code rate of the codeword V is (n-k)/n.

Generally, a generation matrix (hereinafter, marked as G) is used for encoding by the LDPC code, such that Equation (2) below may be satisfied by the vector U being any vector. Herein, a dimension of the generation matrix G is (n-k)-by-n.

$$U \otimes G = [U\ P] = V \tag{2}$$

The codeword V generated by Equation (2) is the valid codeword. Therefore, when Equation (2) is substituted in Equation (1), Equation (3) below may be obtained accordingly.

$$H \otimes G^T \otimes U^T = 0 \tag{3}$$

Since the vector U may be any vector, Equation (4) below definitely be satisfied. In other words, after the parity check matrix H is determined, the corresponding generation matrix G may also be determined.

$$H \otimes G^T = 0 \tag{4}$$

When the codeword V is to be decoded, a parity check process is first performed on the data bits in the codeword V. For example, the parity check matrix H may be multiplied by the codeword V to generate one vector (hereinafter, marked as S, as shown in Equation (5) below). If the vector S is the zero vector (i.e., each element in the vector S is zero), it means that the decoding succeeds, and thus the codeword V may be outputted. If the vector S is not the zero vector (i.e., at least one element in the vector S is not zero), it means that the codeword V includes at least one error and the codeword V is not the valid codeword.

$$H \otimes V^T = S \tag{5}$$

A dimension of the vector S is k-by-1. Each element in the vector S is also known as a syndrome. If the codeword V is not the valid codeword, the ECCC 508 may perform a decoding process to attempt correcting errors in the codeword V.

Figure 6:
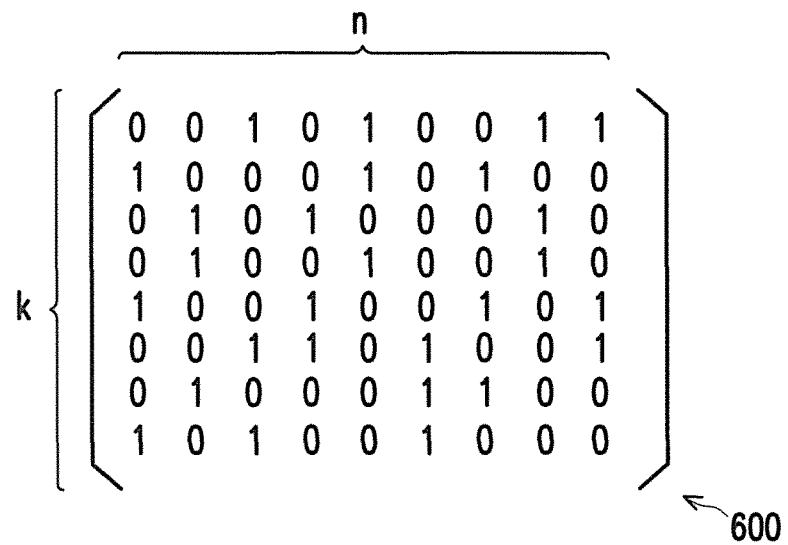
FIG. 6 is a schematic diagram illustrating a parity check matrix according to an exemplary embodiment of the disclosure.

FIG. 6 is a schematic diagram illustrating a parity check matrix according to an exemplary embodiment of the disclosure.

Referring to FIG. 6, a parity check matrix 600 has a dimension being k-by-n. For example, k is 8 and n is 9. However, the disclosure is not intended to limit values of the positive integers k and n. Each row in the parity check matrix 600 also represents a constraint. Take a first row of the parity check matrix 600 for example, when one specific codeword is the valid codeword, the bit "0" may be obtained after performing a modulo-2 addition on third, fifth, eighth and ninth bits in the codeword. Person of ordinary skill in the art should be able to understand how to use the parity check matrix 600 for encoding, and thus related description is omitted hereinafter. In addition, the parity check matrix 600 is merely a sample matrix instead of limitation to the disclosure.

When the MMC 502 intends to store a plurality of bits into the RNVM module 406, the ECCC 508 generates corresponding k parity bits for (n-k) bits to be stored (i.e., the message bits). Next, the MMC 502 writes the n bits (i.e., the data bits) as one codeword into the RNVM module 406.

Figure 7:
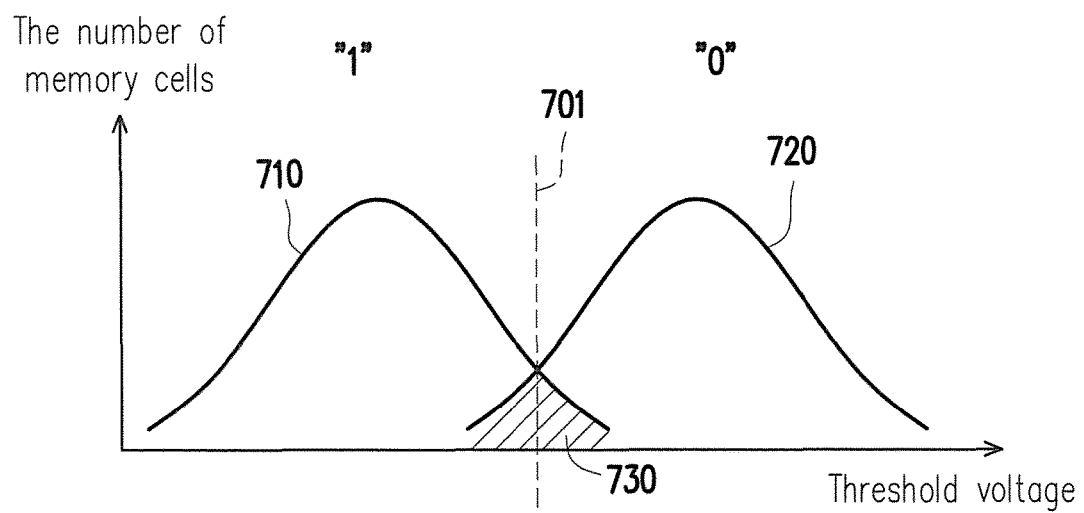
FIG. 7 is a schematic diagram illustrating a threshold voltage distribution of the memory cells according to an exemplary embodiment of the disclosure.

FIG. 7 is a schematic diagram illustrating a threshold voltage distribution of the memory cells according to an exemplary embodiment of the disclosure.

Referring to FIG. 7, a horizontal axis represents the threshold voltages of the memory cells, and a vertical axis represents a number of the memory cells. For example, FIG. 7 illustrates a threshold voltage distribution of memory cells in one specific PPU. It is assumed that a state 710 corresponds to the bit "1" and a state 720 corresponds to the bit "0". If the threshold voltage of one specific memory cell belongs to the state 710, the bit stored by the specific memory cell is the bit otherwise, if the threshold voltage of one specific memory cell belongs to the state 720, the bit stored by the specific memory cell is the bit "0". It is noted that, in the present exemplary embodiment, one state of the threshold voltage distribution corresponds to one bit value (i.e., "0" or "1"), and the threshold voltage distribution of the memory cells includes two possible states. However, in another exemplary embodiments, each state in the threshold voltage distribution may also correspond to a plurality of bit values and the threshold voltage distribution of the memory cells may also include four, eight or any number of possible states. In addition, the bit value represented by each state is not particularly limited by the disclosure. For example, in another exemplary embodiment of FIG. 7, it is also possible that the state 710 corresponds to the bit "0" while the state 720 corresponds to the bit "1".

In the present exemplary embodiment, when it is intended to read the data from the RNVM module 406, the MMC 502 transmits a read command sequence to the RNVM module 406. The read command sequence is configured to instruct the RNVM module 406 to read data (hereinafter referred to as first data) from a plurality of memory cells (hereinafter referred to as first memory cells). In the present exemplary embodiment, the first memory cells belong to the same PPU. However, in another exemplary embodiment, the first memory cells may belong to different PPUs. According to the read command sequence, the RNVM module 406 may read the first memory cells by using a read voltage 701 in FIG. 7. If the threshold voltage of one of the first memory cells is lower than the read voltage 701, such memory cell is turned on and the MMC 502 reads the bit "1". Conversely, if the threshold voltage of one of the first memory cells is higher than the read voltage 701, such memory cell is not turned on and the MMC 502 reads the bit "0".

In the present exemplary embodiment, an overlap region 730 is included between the state 710 and the state 720. An area size of the overlap region 730 is positively correlated to a total number of the memory cells having the threshold voltage that falls within the overlap region 730 among the first memory cells. The overlap region 730 indicates that, some of the memory cells among the first memory cells should have each stored the bit "1" (which belongs to the state 710) but threshold voltage of each of such memory cells is higher than the read voltage 701; alternatively, some of the memory cells among the first memory cells should have each stored the bit "0" (which belongs to the state 720) but threshold voltage of each of such memory cells is lower than the read voltage 701. In other words, some of the bits include error in the data read by applying the read voltage 701.

Generally, if usage time of the first memory cells is not long (e.g., a storage tune of data stored by the first memory cells is not long) and/or usage rate of the first memory cells is not high (e.g., a read count, a write count and/or an erase count of the first memory cells are not high), the area size of the overlap region 730 is usually very small. In some cases, it is even possible that the overlap region 730 does not exist at all (i.e., the states 710 and 720 do not overlap with each other). Alternatively, if the memory storage device 10 just lefts the factory, the overlap region 730 usually does not exist. If the area size of the overlap region 730 is very small, the data read from the first memory cells by applying the read voltage 701 usually includes fewer error bits.

However, the area size of the overlap region 730 will gradually increase with increases in usage time and/or usage rate of the RNVM module 406 (or the first memory cells). For example, if usage time of the first memory cells is very long (e.g., the storage time of the data stored in the first memory cells is very long) and/or usage rate of the first memory cells is very high (e.g., the read count, the write count and/or the erase count of the first memory cells are very high), the area size of the overlap region 730 may become larger (e.g., the states 710 and 720 becomes more flat and/or the states 710 and 720 are closer to each other). If the area size of the overlap region 730 is very large, the data read from the first memory cells by applying the read voltage 701 usually include more error bits. In other words, the area size of the overlap region 730 is positively correlated to an occurrence rate of error bits in the data read from the first memory cells.

In the present exemplary embodiment, after the first data read from the RNVM module 406 is received, the ECCC 508 performs a parity checking process to verify whether the first data includes any error. If the first data includes error, the ECCC 508 performs the decoding operation to attempt correcting the error in the first data.

In the present exemplary embodiment, the ECCC 508 performs an iteration decoding operation. One iteration decoding operation is configured to decode one decoding unit read from the RNVM module 406. For example, one decoding unit is one codeword. In one iteration decoding operation, the parity checking operation for checking correctness of the data and the decoding operation for correcting error in the data are performed repeatedly until the decoding succeeds or an iteration count reaches a predetermined count. If the iteration count reaches the predetermined count, it means that the iteration decoding operation performed on the data fails, such that the ECCC 508 stops decoding this data. In addition, if it is determined through the parity checking operation that one specific data does not include any error, the ECCC 508 outputs the specific data.

In the present exemplary embodiment, the ECCC 508 performs a plurality of decoding operations on the first data based on various decoding conditions. It is noted that, based on different decoding conditions, the strict levels for locating error bit(s) in the first data by the ECCC 508 are different. For example, in some cases, the ECCC 508 performs at least one decoding operation in an iteration decoding operation based on a decoding condition of locating the error bit with a higher strict level (i.e., stricter). In addition, in some cases, the ECCC 508 performs at least one decoding operation in the same iteration decoding operation based on a decoding condition of locating the error bit with a lower strict level (i.e., looser) instead.

In the present exemplary embodiment, locating the error bit with a higher strict level means that the determination and the selection of an error bit from the first data is stricter, therefore one or more bits in the first data are less likely to be determined as error bits. Conversely, locating the error bit with a lower strict level means that the determination and the selection of an error bit from the first data is looser, therefore one or more bits in the first data are more likely to be determined as error bits. In other words, performing decoding operation on a codeword based on a decoding condition of locating the error bit with a lower strict level has a higher probability to flip more bits, but the probability of flipping the bit which is not needed to (i.e., wrongly flip) is thus increased. Conversely, performing decoding operation on a specific codeword based on a decoding condition of locating the error bit with a higher strict level has a higher probability to flip fewer bits, but the probability of flipping the bit which is not needed to is thus decreased. It is noted that, flipping one bit as mentioned above means to change the bit value of the bit. For example, the bit value of one bit is changed from "1" to "0", or changed from "0" to "1".

In the present exemplary embodiment, the ECCC 508 configures a plurality of stages, where each stage corresponds to one decoding condition. In the same iteration decoding operation for the first data, the ECCC 508 may switch between the stages. In addition, the ECCC 508 may perform one or more decoding operations in each stage.

Figure 8:
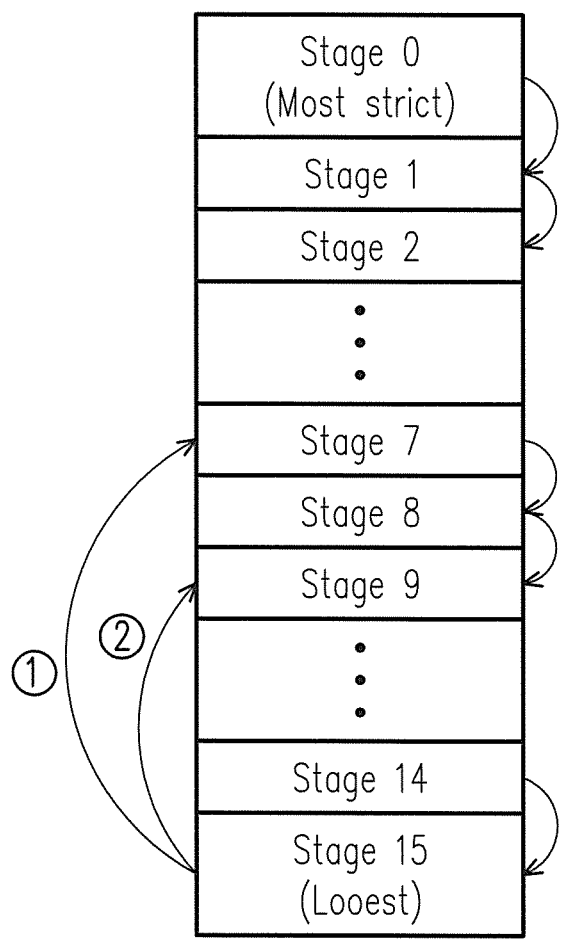
FIG. 8 is a schematic diagram illustrating the operation of switching stages in one iteration decoding operation according to an exemplary embodiment of the disclosure.

FIG. 8 is a schematic diagram illustrating the operation of switching stages in one iteration decoding operation according to an exemplary embodiment of the disclosure. Referring to FIG. 8, it is assumed that the ECCC 508 can change stages between stage 0 to stage 15, where stage 0 is a stage in which the error bits are located with the highest strict level (i.e., most strict), while stage 15 is a stage in which the error bits are located with the lowest strict level (i.e., loosest). The strict level of locating the error bit decreases from stage 0 to stage 15 gradually. For example, the strict level of stage 0 is higher than the strict level of stage 1. The strict level of stage 1 is higher than the strict level of stage 2, and the strict level of stage 14 is higher than the strict level of stage 15.

In the present exemplary embodiment, if the ECCC 508 is currently operating in stage 0 (i.e., performing decoding operation based on the decoding condition of stage 0) and determines that the decoding condition needs to be switched, the ECCC 508 switches to stage 1. If the ECCC 508 is operating in stage 1 (i.e., performing decoding operation based on the decoding condition of stage 1) and determines that the decoding condition needs to be switched, the ECCC 508 switches to stage 2 and so on. The ECCC 508 may switch from stage 0 to stage 15 one by one in one iteration decoding operation for the first data until one of the decoding operations succeeds or the iteration count reaches the predetermined count. It is noted that, in the operation of switching from stage 0 to stage 15 one by one, the locating of error bit from data to be decoded performed by the checking and correcting circuit 508 is getting looser and looser. Therefore, a total number of error bits flipped in each decoding operation may increase gradually. However, it also represents that a total number of bits wrongly flipped in each decoding operation may increase correspondingly.

In some cases, if there are too many bits wrongly flipped in the decoding operation, multiple sequentially performed decoding operations may keep in a diverging state of error bits. In such diverging state, the total number of error bits in the data may not reduce or may fluctuate even though there are more decoding operations being performed, and finally the whole iteration decoding operation is thus failed (e.g., the iteration count reaches the predetermined count). Accordingly, in the present exemplary embodiment, the ECCC 508 may return from stage 15 to one of stages 1 to 14. By re-raising the strict level of locating the error bit in the decoding operation, the decoding operation successively performed may have a high probability to disengage from the diverging state of error bits, so the subsequent decoding success rate is raised. In addition, comparing to the general use of noising or other similar ways to try to disengage from the diverging state, there is a higher probability to flip the real error bit by re-raising the strict level of locating the error bit in the decoding operation.

Referring back to FIG. 8, if the ECCC 508 currently operates in stage 15 (i.e., performing decoding operation based on the decoding condition of stage 15) and determines that the decoding condition needs to be switched, the ECCC 508 returns to one stage of stage 1 to stage 14, so as to raise the strict level of locating the error bit in the next decoding operation. After switching from stage 15 to the stage with a higher strict level, the ECCC 508 may continually switch to stage 15, unless one of the decoding operations performed in these periods succeeds, or the iteration count reaches the predetermined count. In addition, in the same iteration decoding operation for the first data, if the ECCC 508 switches to previous stage multiple times, the stages switched to may be different. Taking FIG. 8 as an example, if stage 7 is being switched from stage 15 (marked as "1" in FIG. 8), stage 9 is being switched from stage 15 the next time (marked as "2" in FIG. 8).

It is noted that stage 0 to stage 15 in FIG. 8 are merely an example. In other exemplary embodiments not mentioned, the total number of the stages operable by the ECCC 508 may be more or less. In addition, the ECCC 508 may also skip one or more stages in one single switch, e.g., switching from stage 0 to stage 2 directly.

Specifically, it is assumed that the ECCC 508 currently performs one decoding operation (hereinafter referred to as first decoding operation) on the first data based on one decoding condition (hereinafter referred to as first decoding condition). If the first decoding operation fails, the MMC 502 determines whether the first decoding operation conforms to a default status (hereinafter referred to as first default status). If the first decoding operation conforms to the first default status, the ECCC 508 performs another decoding operation (hereinafter referred to as second decoding operation) on the first data based on another decoding condition (hereinafter referred to as second decoding condition). In which, a strict level of locating the error bit in the first data based on the second decoding condition is higher than a strict level of locating the error bit in the first data based on the first decoding condition.

In addition, the MMC 502 further determines whether the first decoding operation conforms to another default status (hereinafter referred to as second default status). If the first decoding operation conforms to the second default status, the ECCC 508 performs another decoding operation (hereinafter referred to as third decoding operation) on the first data based on another decoding condition (hereinafter referred to as third decoding condition), where a strict level of locating the error bit in the first data based on the third decoding condition is lower than the strict level of locating the error bit in the first data based on the first decoding condition. If the first decoding operation does not conform to the first default status and the second default status, the ECCC 508 performs the first decoding operation on the first data based on the first decoding condition again.

Figure 9A:
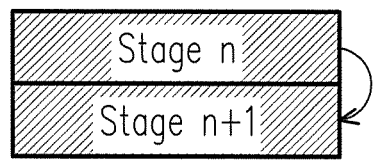
FIG. 9A is a schematic diagram illustrating the operation of switching stages according to an exemplary embodiment of the disclosure.

FIG. 9A is a schematic diagram illustrating the operation of switching stages according to an exemplary embodiment of the disclosure. Referring to FIG. 9A, it is assumed that the ECCC 508 currently operates in stage n (i.e., first decoding condition). If the first decoding operation operated in stage n fails and a stop condition of the whole iteration decoding operation (e.g., the iteration count reaches the predetermined count) is not met, the MMC 502 determines whether the first decoding condition conforms to a stage condition. For example, the MMC 502 determines whether stage n is a stage in which the error bit is located with the lowest strict level (e.g., stage 15 in FIG. 8). If stage n is not the stage in which the error bit is located with the lowest strict level (e.g., stage n may be an arbitrary stage of stage 0 to stage 14 in FIG. 8), the MMC 508 determines the first decoding condition does not conform to the stage condition. In addition, the MMC 502 determines whether a total number of bits flipped by the first decoding operation conforms to a number condition. For example, if the total number of bits flipped by the first decoding operation is zero (i.e., no bit is flipped in the first decoding operation), the MMC 502 determines the total number of bits flipped by the first decoding operation conforms to the number condition. Conversely, if the total number of bits flipped by the first decoding operation is not zero (i.e., at least one bit is flipped in the first decoding operation), the MMC 502 determines the total number of bits flipped by the first decoding operation does not conform to the number condition. If the first decoding condition does not conform to the stage condition and the total number of bits flipped by the first decoding operation conforms to the number condition, the ECCC 508 switches to operate in stage n+1 (i.e., third decoding condition).

In other words, in the present exemplary embodiment, since the last performed decoding operation (i.e., first decoding operation) does not flip any bit and there is still other usable decoding condition with lower strict level, the ECCC 508 may decrease the strict level of locating the error bit in the next decoding operation, so as to raise the probability that at least one bit is flipped in the data to be decoded.

Figure 9B:
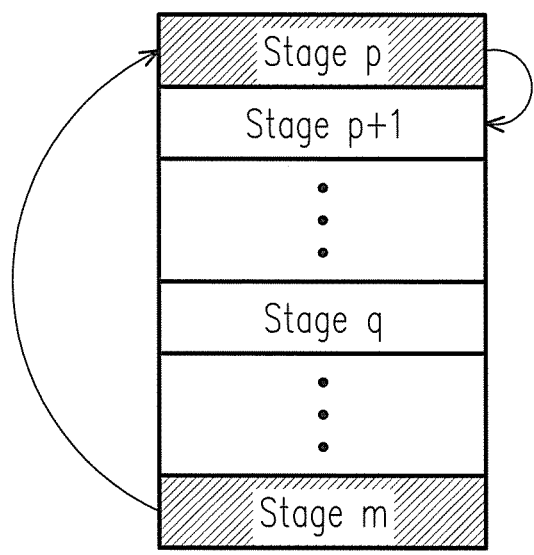
FIG. 9B is a schematic diagram illustrating the operation of switching stages according to another exemplary embodiment of the disclosure.

FIG. 9B is a schematic diagram illustrating the operation of switching stages according to another exemplary embodiment of the disclosure. Referring to FIG. 9B, it is assumed that the ECCC 508 currently operates in stage m (i.e., first decoding condition). If the first decoding operation operated in stage m fails and the stop condition of the whole iteration decoding operation is not met, the MMC 502 determines whether the first decoding condition conforms to the stage condition. Since stage in is the stage in which the error bit is located with the lowest strict level (e.g., stage 15 in FIG. 8), the MMC 508 determines that the first decoding condition conforms to the stage condition. After it is determined that the first decoding condition conforms to the stage condition, the MMC 502 counts an iteration count value of the first decoding operation, where the iteration count value indicates how many times the first decoding operation being performed iteratively. Then, the MMC 502 determines whether the iteration count value conforms to a counting condition. If the iteration count value does not conform to the counting condition, the ECCC 508 performs the first decoding operation operated in stage m continually. If the iteration count value conforms to the counting condition, e.g., the iteration count value reaches 10, the ECCC 508 switches to stage p with a higher strict level of locating the error bit (i.e., second decoding condition).

In other words, in the present exemplary embodiment, the first decoding operation operated in stage m is repeatedly performed multiple times (e.g., 10 times) and the first data is still not decoded successfully. Therefore there is higher probability that too many bits which are not needed to be flipped are repeatedly flipped. In this case, the ECCC 508 raises the strict level of locating the error bit in the next decoding operation, so as to reduce the probability of part of bits being wrongly flipped. In addition, after operating in stage p, the ECCC 508 may be continually operated in stage p+1 or so, as the exemplary embodiment of FIG. 9A, which is not repeatedly described herein.

Figure 9C:
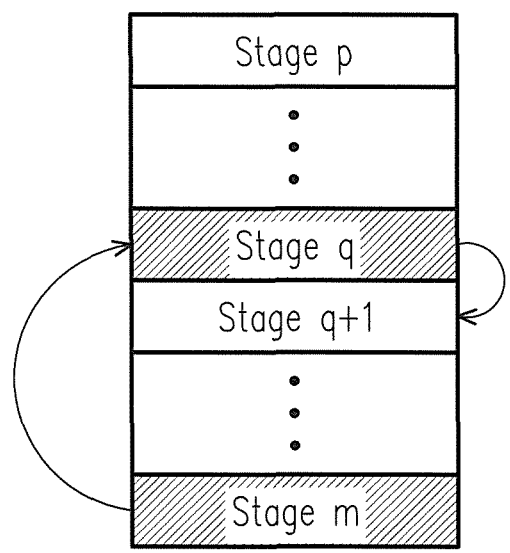
FIG. 9C is a schematic diagram illustrating the operation of switching stages according to another exemplary embodiment of the disclosure.

FIG. 9C is a schematic diagram illustrating the operation of switching stages according to another exemplary embodiment of the disclosure. Referring to FIG. 9C, in consecutive to the exemplary embodiment of FIG. 9B, if the ECCC 508 is operated in stage m again, the decoding operation operated in stage m (i.e., first decoding operation) fails and the stop condition of the whole iteration decoding operation is not met, the MMC 502 again determines that the first decoding operation conforms to the stage condition and counts the iteration count value of the first decoding operation. For example, the iteration count value indicates how many times the first decoding operation operated in stage m being performed after the ECCC 508 returns to stage m from stage p. Then, the MMC 502 determines whether the iteration count value conforms to a counting condition. For example, the MMC 502 determines whether the iteration count value corresponding to the first decoding operation operated in stage m is equal to 7. If the iteration count value does not conform to the counting condition (e.g., the iteration count value is smaller than 7), the ECCC 508 may perform the first decoding operation operated in stage m repeatedly. If the iteration count value conforms to the counting condition, e.g., the iteration count value reaches 7, the ECCC 508 switches to stage q with a higher strict level of locating the error bit (i.e., a new second decoding condition). After operating in stage q, the ECCC 508 may be continually operated in stage q+1 or so, as the exemplary embodiment of FIG. 9A, which is not repeatedly described herein.

It is noted that in an exemplary embodiments of FIG. 9B and FIG. 9C, the counting conditions for determining whether to return to the previous stage p (or q) or to continually maintain in stage m are different. For example, in one iteration decoding operation for the first data, the MMC 502 may select the counting conditions corresponding to different count values from multiple candidate counting conditions as a basis for determining whether to return to the previous stage. For example, in an exemplary embodiment of FIG. 9B, the MMC 502 may select a candidate counting condition (hereinafter referred to as first candidate counting condition) from multiple candidate counting conditions as the currently used counting condition, where the first candidate counting condition corresponds to the first count value (e.g., 10). Then, in an exemplary embodiment of FIG. 9C, the MMC 502 changes to select another candidate counting condition (hereinafter referred to as second candidate counting condition) from the candidate counting conditions as the currently used counting condition, where the second candidate counting condition corresponds to the second count value (e.g., 7). By sequentially reducing the count value of the used counting condition, the performing efficiency of the whole iteration decoding operation may be improved. However, in another exemplary embodiment, the used counting condition may be unchanged in the same iteration decoding operation for the first data.

In an exemplary embodiment of FIG. 9B and FIG. 9C, stage p is different from stage q (i.e., p does not equal to q), where the strict level of locating the error bit of stage p is higher than the strict level of locating the error bit of stage q. For example, in one iteration decoding operation for the first data, the MMC 502 may select a suitable decoding condition from multiple candidate decoding conditions as the second decoding condition. For example, in an exemplary embodiment of FIG. 9B, the MMC 502 may select a candidate decoding condition (hereinafter referred to as first candidate decoding condition) from multiple candidate decoding conditions as the second decoding condition to be used, which corresponds to stage p. Then, in an exemplary embodiment of FIG. 9C, the MMC 502 changes to select another candidate decoding condition (hereinafter referred to as second candidate decoding condition) from the candidate decoding conditions as the second decoding condition to be used, which corresponds to stage q. By changing the second decoding condition from stage p to stage q, the performing efficiency of the whole iteration decoding operation may also be improved. However, in another exemplary embodiment, in the same iteration decoding operation for the first data, the ECCC 508 may also switch from stage m to the same stage (e.g., stage p or stage q) instead of different stages.

FIG. 10 is a schematic diagram illustrating a parity check operation according to an exemplary embodiment of the disclosure. Referring to FIG. 10, it is assumed that the first data read from the first memory cells includes a codeword 1001. In the parity check operation for the codeword 1001, a parity check matrix 1000 is multiplied by the codeword 1001 to obtain a syndrome vector 1002 (i.e., the vector S) according to Equation (5). Herein, each bit in the codeword 1001 corresponds to at least one element (i.e., the syndrome) in the syndrome vector 1002. For example, a bit $V_0$ in the codeword 1001 (corresponding to a first column of the parity check matrix 1000) corresponds to syndromes $S_1$, $S_4$ and $S_7$; a bit $V_1$ (corresponding to a second column of the parity check matrix 1000) corresponds to syndromes $S_2$, $S_3$ and $S_6$; and the rest may be deduced by analogy. If the bit $V_0$ is the error bit, at least one of the syndromes $S_1$, $S_4$ and $S_7$ may be "1". If the bit $V_1$ is the error bit, at least one of the syndromes $S_2$, $S_3$ and $S_6$ may be "1", and the rest may be deduced by analogy. In other words, if the syndromes $S_0$ to $S_7$ are all "0", it means that codeword 1001 may not include any error bit, and thus the ECCC 508 may directly output the codeword 1001. However, if the codeword 1001 includes at least one error bit, at least one of the syndromes $S_0$ to $S_7$ may be "1", and thus the ECCC 508 performs the decoding operation on the codeword 1001.

In the present exemplary embodiment, the ECCC 508 performs the decoding operation by using the Bit-Flipping algorithm, therefore the ECCC 508 identifies the bits needing to be flipped (i.e., error bits) in the first data based on a flipping threshold value. Herein, each stage (or decoding condition) corresponds to one flipping threshold value. For example, in an exemplary embodiment of FIG. 8, the flipping threshold value corresponding to stage 0 is the largest, the flipping threshold value corresponding to stage 15 is the smallest, and the flipping threshold value decreases from stage 0 to stage 15 gradually. However, in another exemplary embodiment, the ECCC 508 may also perform the decoding operation by using other decoding algorithms such as Min-Sum algorithm or Sum-Product algorithm.

In the present exemplary embodiment, the ECCC 508 calculates an error weighting value of each bit in the codeword 1001 according to the parity check matrix 1000 and the syndrome vector 1002. For example, the ECCC 502 adds the syndromes corresponding to the same bit in the codeword 1001 together in order to obtain the error weighting value of the respective bit. For example, $E_0$ to $E_8$ indicates the error weighting values of the bits $V_0$ to $V_8$ respectively, where the error weighting value $E_0$ of the bit $V_0$ is equal to a sum of the syndromes $S_1$, $S_4$ and $S_7$; the error weighting value $E_1$ of the bit $V_1$ is equal to a sum of the syndromes $S_2$, $S_3$ and $S_6$, and the rest may be deduced by analogy. It is noted that, the addition applied on the syndromes $S_0$ to $S_7$ is a normal addition instead of the modulo-2 addition. For example, the ECCC 508 may obtain the error weighting value of each bit in the codeword 1001 by using Equation (6) below. Herein, each element in a vector f may be used to represent the error weighting value of each bit in the codeword.

$$f = S^T \times H \qquad (6)$$

After the error weighting values are obtained, the ECCC 508 may flip all or at least one part of the bits in the codeword 1001 each having the error weighting value greater than the used flipping threshold value. Accordingly, by switching the stages (or decoding conditions), the flipping threshold value, for identifying error bits, used by the ECCC 508 is thus adjusted, so that whether the error bit is located strictly or loosely in one decoding operation performed by the ECCC 508 may be determined as well.

In an exemplary embodiment, the ECCC 508 defines the error weighting value of each bit in the first data by using Equation (7) below, where Equation (7) is also referred to as cost function.

$$EW_i = \alpha A_i + \beta B_i \qquad (7)$$

In Equation (7), $EW_i$ indicates the error weighting value of the $i^{th}$ bit in the first data (i.e., the bit $V_i$), $A_i$ is equal to $E_i$ of the exemplary embodiment of FIG. 10, and the value of $B_i$ is set corresponding to whether or not the current value of the bit $V_i$ is equal to the initial value of the same bit $V_i$. For example, it is assumed that the initial value of the bit $V_i$ is "1", after at least one decoding operation, if the bit $V_i$ is changed to "0", the value of $B_i$ is set to "1" for indicating that the current value and the initial value of the same bit $V_i$ are different. Conversely, after at least one decoding operation, if the bit $V_i$ is still being "1", the value of $B_i$ is set to "0" for indicating that the current value of the bit $V_i$ is equal to the initial value of the same bit $V_i$. In addition, $\alpha$ and $\beta$ are constants. Comparing to directly take $E_i$ as the error weighting value of the bit $V_i$, Equation (7) adjusts the error weighting value $EW_i$ of the bit $V_i$ by using more parameters. In some cases, the error weighting value $EW_i$ is more accurate than the error weighting value $E_i$ for locating error bit.

In an exemplary embodiment, after the syndrome vector of the first data is obtained, the ECCC 508 obtains the syndrome summation of the first data. Taking FIG. 10 as an example, the ECCC 508 accumulates the syndromes $S_0$ to $S_7$ together in order to obtain the syndrome summation corresponding to the codeword 1001. For example, if there are k syndromes each having the value "1" in the syndromes $S_0$ to $S_7$, the syndrome summation of the codeword 1001 is k. The ECCC 508 determines whether the syndrome summation is less than a default value. If the syndrome summation is less than the default value, the ECCC 508 decreases the error weighting value of each bit in the first data, for example, decrease from a first error weighting value into a second error weighting value. After the error weighting value of each bit in the first data is decreased, the next decoding operation may be performed. For example, in the next decoding operation (e.g., first decoding operation), if the decreased error weighting value of one specific bit (i.e., second error weighting value) is larger than the flipping threshold value corresponding to the used first decoding condition, the ECCC 508 flips the bit in the first decoding operation. However, if the syndrome summation is not less than the default value, the ECCC 508 does not decrease the error weighting value of each bit in the first data.

In an exemplary embodiment, if it is determined that the syndrome summation is less than the default value, the ECCC 508 calculates the error weighting value of each bit in the first data by using Equation (8) instead. Comparing to Equation (7), the calculated error weighting value may be decreased by using Equation (8).

$$EW_i = \alpha A_i \qquad (8)$$

It is noted that, although the Bit-Flipping algorithm is taken as an example in the aforementioned exemplary embodiments, the ECCC 508 may also perform the decoding operation by using other decoding algorithms such as Min-Sum algorithm or Sum-Product algorithm in other embodiments not mentioned. People having ordinary skill in the art should figure out which parameters are needing to be adjusted for adjusting the strict level of locating the error bit in various decoding algorithms, which is not repeatedly described herein.

Figure 11:
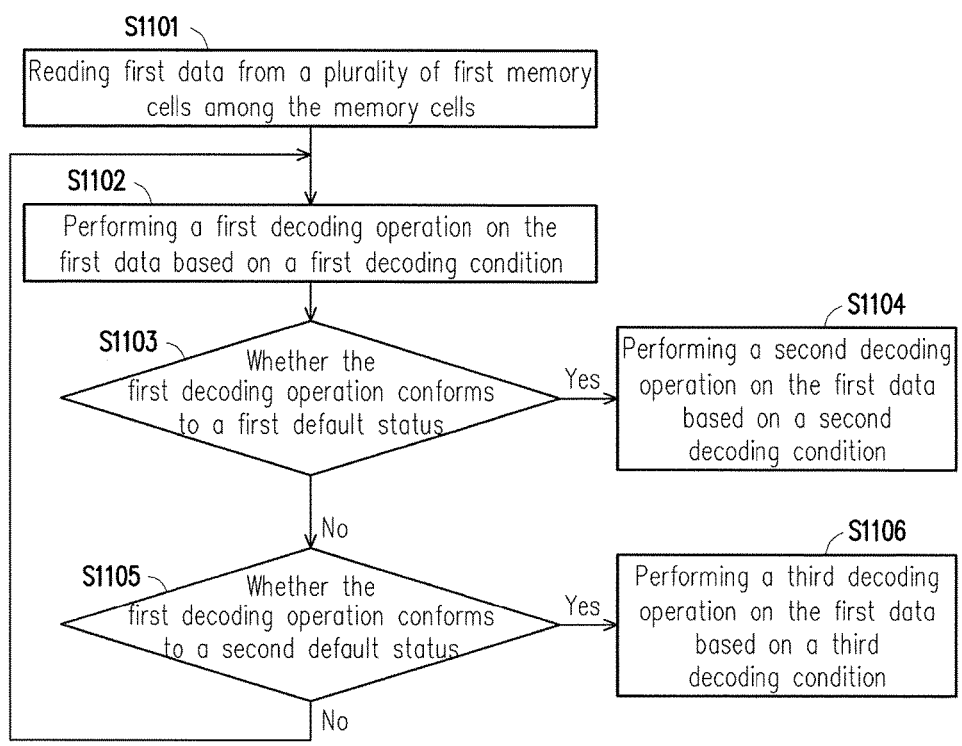
FIG. 11 is a flow chart illustrating a decoding method according to an exemplary embodiment of the disclosure.

FIG. 11 is a flow chart illustrating a decoding method according to an exemplary embodiment of the disclosure. Referring to FIG. 11, in step S1101, first data is read from a plurality of first memory cells of a RNVM module. In step S1102, a first decoding operation is performed on the first data based on a first decoding condition. It is noted that how many decoding operations are performed before the first decoding operation after reading the first data is not limited in the disclosure, as long as these decoding operations belong to the same iteration decoding operation for the first data. In step S1103, it is determined whether the first decoding operation conforms to a first default status. If the first decoding operation conforms to the first default status, in step S1104, a second decoding operation is performed on the first data based on a second decoding condition. Herein, a strict level of locating an error bit in the first data based on the second decoding condition is higher than a strict level of locating the error bit in the first data based on the first decoding condition. If the first decoding operation does not conform to the first default status, in step S1105, it is determined whether the first decoding operation conforms to a second default status. If the first decoding operation conforms to the second default status, in step S1106, a third decoding operation is performed on the first data based on a third decoding condition. Herein, a strict level of locating an error bit in the first data based on the third decoding condition s lower than the strict level of locating the error bit in the first data based on the first decoding condition. If the first decoding operation does not conform to both the first default status and the second default status, step S1102 may be performed repeatedly after step S1105. It should be noted that, in the decoding method of FIG. 11, the whole iteration decoding operation for the first data stops if a stop condition of the iteration decoding operation is met (e.g., decoding succeeds or an iteration count reaches a predetermined count).

Figure 12:
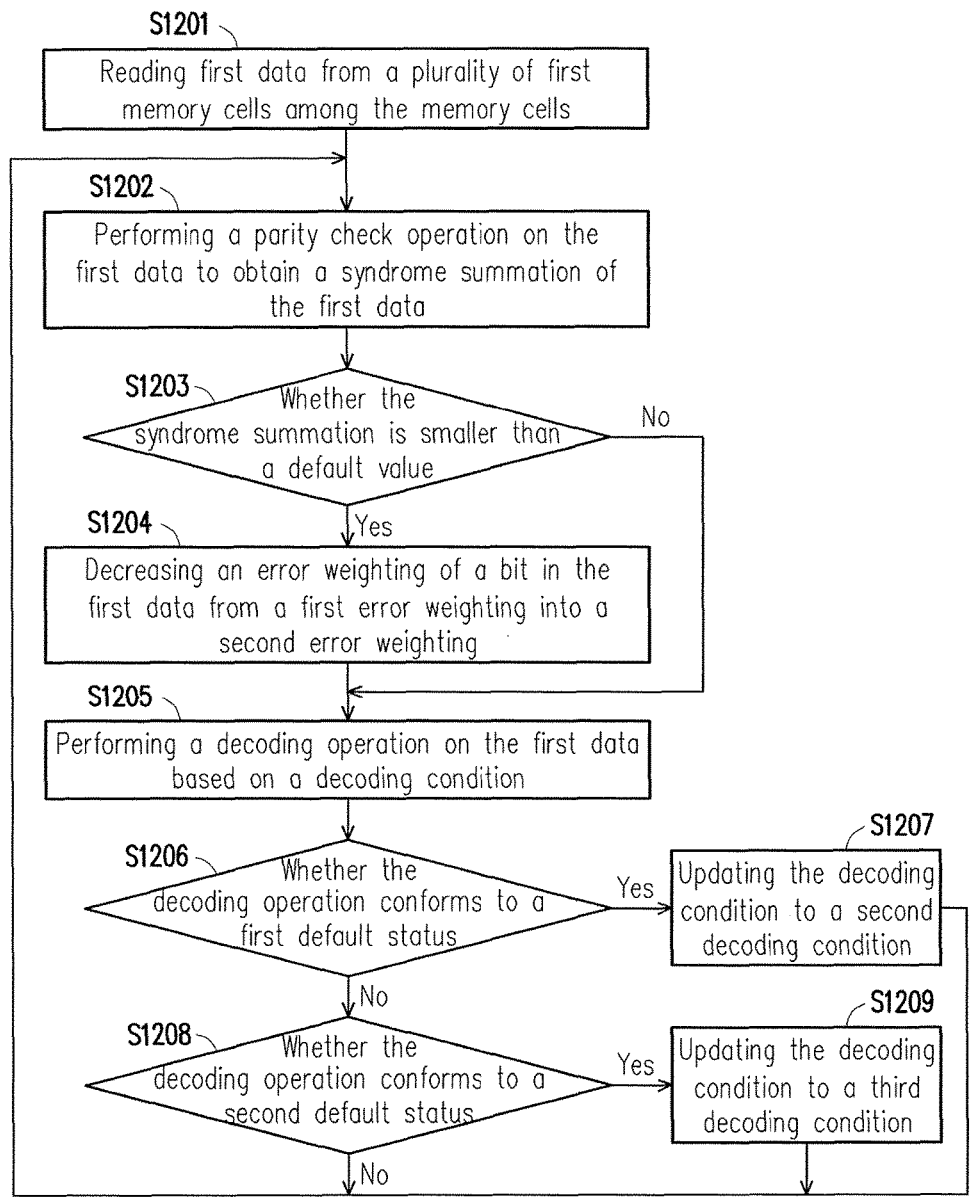
FIG. 12 is a flow chart illustrating a decoding method according to another exemplary embodiment of the disclosure.

FIG. 12 is a flow chart illustrating a decoding method according to another exemplary embodiment of the disclosure. Referring to FIG. 12, in step S1201, first data is read from a plurality of first memory cells of a RNVM module. In step S1202, a parity check operation is performed on the first data to obtain a syndrome summation of the first data. In step S1203, it is determined whether the syndrome summation is less than a default value. If the syndrome summation is less than the default value, in step S1204, the error weighting value of each bit in the first data is decreased from a first error weighting value into a second error weighting value. In step S1205, a decoding operation is performed on the first data based on a decoding condition. For example, the decoding condition is the first decoding condition. In addition, if the syndrome summation is not less than the default value, step S1205 is also entered after step S1203. In step S1206, it is determined whether the decoding operation conforms to a first default status. If the decoding operation conforms to the first default status, in step S1207, the decoding condition is updated to a second decoding condition. Herein, a strict level of locating an error bit in the first data based on the second decoding condition is higher than a strict level of locating the error bit in the first data based on the first decoding condition. If the decoding operation does not conform to the first default status, in step S1208, it is determined whether the decoding operation conforms to a second default status. If the decoding operation conforms to the second default status, in step S1209, the decoding condition is updated to a third decoding condition. Herein, a strict level of locating an error bit in the first data based on the third decoding condition is lower than the strict level of locating the error bit in the first data based on the first decoding condition. If the decoding operation does not conform to any one of the first default status and the second default status, step S1202 may be performed repeatedly after step S1208. In addition, step S1202 may be repeatedly performed after step S1207 and S1209 as well. It is noted that, in the decoding method of FIG. 12, the whole iteration decoding operation for the first data stops if a stop condition of the iteration decoding operation is met (e.g., decoding succeeds or an iteration count reaches a predetermined count).

However, every steps in FIG. 11 and FIG. 12 are illustrated above and not repeated herein. It is noted that each step in FIG. 11 and FIG. 12 may be implemented as multiple programming codes or circuits, which is not limited in the present disclosure. In addition, the method of FIG. 11 and FIG. 12 may be applied in accompany with the aforementioned exemplary embodiments, or may be applied individually, which is not limited in the present disclosure.

In summary, the strict level of locating the error bit of the decoding operation may be flexibly adjusted in one iteration decoding operation according to the present disclosure. In addition, the decoding efficiency of the memory storage device may be improved through the configured switching rules.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A decoding method for a rewritable non-volatile memory module comprising a plurality of memory cells, the decoding method comprising:
   reading, through a memory interface coupled to the rewritable non-volatile memory module, first data from a plurality of first memory cells under a read voltage among the memory cells;
   performing, by an error checking and correcting circuit, a first decoding operation on the first data based on a first strict level of a plurality of predetermined strict levels of locating an error bit in the first data;

performing, by the error checking and correcting circuit, the first decoding operation again or a second decoding operation on the first data based on a second strict level or a third strict level of a plurality of predetermined strict levels of locating an error bit in the first data if the first decoding operation fails, comprising:
- if an iteration number of the first decoding operation reaches a predetermined number, switching to the second strict level which is higher than the first strict level and performing the second decoding operation based on the second strict level, in order to reduce a probability of a bit being wrongly flipped in the second decoding operation;
- if a number of bits flipped by the first decoding operation is zero, switching to the third strict level which is lower than the first strict level and performing the second decoding operation based on the third strict level, in order to raise a probability that at least one bit is flipped in the second decoding operation; and
- otherwise, performing the first decoding operation on the first data based on the first strict level again; and outputting the decoded first data by the error checking and correcting circuit.

2. The decoding method as claimed in claim 1, further comprising:
selecting the predetermined number from a first count value and a second count value wherein the first count value is different from the second count value.

3. The decoding method as claimed in claim 1, further comprising:
selecting the second strict level from two predetermined strict levels within the plurality of predetermined strict levels,
wherein each of the two predetermined strict levels is higher than the first strict level.

4. The decoding method as claimed in claim 1, wherein each of the plurality of predetermined strict levels corresponds to a flipping threshold value, the decoding method further comprising:
performing a parity check operation on the first data to obtain a syndrome summation of the first data;
decreasing an error weighting value of a bit in the first data from a first error weighting value into a second error weighting value if the syndrome summation is less than a default value; and
flipping the bit in the first decoding operation if the second error weighting value is larger than the flipping threshold value corresponding to the first strict level.

5. A memory storage device, comprising:
a connection interface unit, configured to couple to a host system;
a rewritable non-volatile memory module, comprising a plurality of memory cells; and
a memory control circuit unit, coupled to the connection interface unit and the rewritable non-volatile memory module,
wherein the memory control circuit unit is configured to:
transmit a read command sequence, wherein the read command sequence instructs reading first data from a plurality of first memory cells under a read voltage among the memory cells,
perform a first decoding operation on the first data based on a first strict level of a plurality of predetermined strict levels of locating an error bit in the first data;
perform the first decoding operation again or a second decoding operation on the first data based on a second strict level or a third strict level of a plurality of predetermined strict levels of locating an error bit in the first data if the first decoding operation fails, comprising:
- if an iteration number of the first decoding operation reaches a predetermined number, switching to the second strict level which is higher than the first strict level and performing the second decoding operation based on the second strict level, in order to reduce a probability of a bit being wrongly flipped in the second decoding operation;
- if a number of bits flipped by the first decoding operation is zero, switching to the third strict level which is lower than the first strict level and performing the second decoding operation based on the third strict level, in order to raise a probability that at least one bit is flipped in the second decoding operation; and
- otherwise, performing the first decoding operation on the first data based on the first strict level again; and output the decoded first data.

6. The memory storage device as claimed in claim 5, wherein the memory control circuit unit is further configured to select the predetermined number from a first count value and a second count value,
wherein the first count value is different from the second count value.

7. The memory storage device as claimed in claim 5, wherein the memory control circuit unit is further configured to select the second strict level from two predetermined strict levels within the plurality of predetermined strict levels,
wherein each of the two predetermined strict levels is higher than the first strict level.

8. The memory storage device as claimed in claim 5, wherein each of the plurality of predetermined strict levels corresponds to a flipping threshold value, wherein the memory control circuit unit is further configured to perform a parity check operation on the first data to obtain a syndrome summation of the first data,
wherein the memory control circuit unit is further configured to decrease an error weighting value of a bit in the first data from a first error weighting value into a second error weighting value if the syndrome summation is less than a default value,
wherein the memory control circuit unit is further configured to flip the bit in the first decoding operation if the second error weighting value is larger than the flipping threshold value corresponding to the first strict level.

9. A memory control circuit unit, for controlling a rewritable non-volatile memory module comprising a plurality of memory cells, the memory control circuit unit comprising:
a host interface, configured to couple to a host system;
a memory interface, configured to couple to the rewritable non-volatile memory module;
an error checking and correcting circuit; and
a memory management circuit, coupled to the host interface, the memory interface and the error checking and correcting circuit,
wherein the memory management circuit is configured to send a read command sequence, wherein the read command sequence instructs reading first data from a plurality of first memory cells under a read voltage among the memory cells, wherein the error checking and correcting circuit is configured to perform a first decoding operation on the first data based on a first strict level of a plurality of predetermined strict levels of locating an error bit in the first data, wherein the error checking and correcting circuit is configured to perform the first decoding operation again or a second decoding operation on the first data based on a second strict level or a third strict level of a plurality of predetermined strict levels of locating an error bit in the first data if the first decoding operation fails, comprising:

if an iteration number of the first decoding operation reaches a predetermined number, switching to the second strict level which is higher than the first strict level and performing the second decoding operation based on the second strict level, in order to reduce a probability of a bit being wrongly flipped in the second decoding operation;

if a number of bits flipped by the first decoding operation is zero, switching to the third strict level which is lower than the first strict level and performing the second decoding operation based on the third strict level, in order to raise a probability that at least one bit is flipped in the second decoding operation; and otherwise, performing the first decoding operation on the first data based on the first strict level again, and wherein the error checking and correcting circuit is further configured to output the decoded first data.

10. The memory control circuit unit of claim 9, wherein the memory management circuit is further configured to select the predetermined number from a first count value and a second count value, wherein the first count value is different from the second count value.

11. The memory control circuit unit of claim 9, wherein the memory management circuit is further configured to select the second strict level from two predetermined strict levels within the plurality of predetermined strict levels, wherein each of the two predetermined strict levels is higher than the first strict level.

12. The memory control circuit unit of claim 9, wherein each of the plurality of predetermined strict levels corresponds to a flipping threshold value, wherein the error checking and correcting circuit is further configured to perform a parity check operation on the first data to obtain a syndrome summation of the first data, wherein the error checking and correcting circuit is further configured to decrease an error weighting value of a bit in the first data from a first error weighting value into a second error weighting value if the syndrome summation is less than a default value, wherein the error checking and correcting circuit is further configured to flip the bit in the first decoding operation if the second error weighting value is larger than the flipping threshold value corresponding to the first strict level.

* * * * *